United States Patent
Yokota et al.

(10) Patent No.: US 9,117,661 B2
(45) Date of Patent: *Aug. 25, 2015

(54) METHOD OF IMPROVING OXIDE GROWTH RATE OF SELECTIVE OXIDATION PROCESSES

(71) Applicant: Applied Materials, Inc., Santa Clara, CA (US)

(72) Inventors: Yoshitaka Yokota, San Jose, CA (US); Norman L. Tam, San Jose, CA (US); Balasubramanian Ramachandran, Santa Clara, CA (US); Martin John Ripley, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/043,505

(22) Filed: Oct. 1, 2013

(65) Prior Publication Data
US 2014/0057455 A1  Feb. 27, 2014

Related U.S. Application Data

(63) Continuation of application No. 13/117,931, filed on May 27, 2011, now Pat. No. 8,546,271, and a continuation of application No. 11/860,161, filed on Sep. 24, 2007, now Pat. No. 7,951,728.

(51) Int. Cl.
*H01L 21/02* (2006.01)
*H01L 21/28* (2006.01)
(Continued)

(52) U.S. Cl.
CPC ...... *H01L 21/02238* (2013.01); *H01L 21/0223* (2013.01); *H01L 21/02255* (2013.01); *H01L 21/28247* (2013.01); *H01L 21/31662* (2013.01); *H01L 21/32* (2013.01)

(58) Field of Classification Search
CPC ................. H01L 21/76254; H01L 21/76259; H01L 21/84; H01L 21/785
USPC .......... 438/769, 785–799; 257/E21.268, 282, 257/634, 639
See application file for complete search history.

(56) References Cited

U.S. PATENT DOCUMENTS

| 4,505,028 A | 3/1985 | Kobayashi et al. |
| 5,015,587 A | 5/1991 | Patton |

(Continued)

FOREIGN PATENT DOCUMENTS

| CN | 1469438 A | 1/2004 |
| JP | 2001-223213 A | 8/2001 |

(Continued)

OTHER PUBLICATIONS

Office Action of the State Intellectual Property Office of the People's Republic of China in Chinese Patent Application Serial No. 200810161248.0 dated Apr. 16, 2013.
(Continued)

*Primary Examiner* — Michael Lebentritt
(74) *Attorney, Agent, or Firm* — Patterson & Sheridan, LLP

(57) ABSTRACT

A method for selective oxidation of silicon containing materials in a semiconductor device is disclosed and claimed. In one aspect, a rapid thermal processing apparatus is used to selectively oxidize a substrate by in-situ steam generation at high pressure in a hydrogen rich atmosphere. Other materials, such as metals and barrier layers, in the substrate are not oxidized.

13 Claims, 8 Drawing Sheets

(51) Int. Cl.
H01L 21/316 (2006.01)
H01L 21/32 (2006.01)

(56) References Cited

U.S. PATENT DOCUMENTS

| | | |
|---|---|---|
| 5,851,892 A | 12/1998 | Lojek et al. |
| 6,005,225 A | 12/1999 | Kowalski et al. |
| 6,037,273 A | 3/2000 | Gronet et al. |
| 6,066,508 A | 5/2000 | Tanabe et al. |
| 6,100,188 A | 8/2000 | Lu et al. |
| 6,114,258 A | 9/2000 | Miner et al. |
| 6,221,791 B1 | 4/2001 | Wang et al. |
| 6,239,041 B1 | 5/2001 | Tanabe et al. |
| 6,291,868 B1 | 9/2001 | Weimer et al. |
| 6,323,115 B1 | 11/2001 | Tanabe et al. |
| 6,335,295 B1 | 1/2002 | Patel |
| 6,362,086 B2 | 3/2002 | Weimer et al. |
| 6,372,663 B1 | 4/2002 | Yeh et al. |
| 6,429,496 B1 | 8/2002 | Li et al. |
| 6,441,350 B1 | 8/2002 | Stoddard et al. |
| 6,458,714 B1 | 10/2002 | Powell et al. |
| 6,534,401 B2 | 3/2003 | Joo et al. |
| 6,774,012 B1 | 8/2004 | Narayanan |
| 6,784,116 B2 | 8/2004 | Tanabe et al. |
| 6,916,744 B2 | 7/2005 | Achutharaman et al. |
| 6,927,169 B2 | 8/2005 | Maydan et al. |
| 7,109,131 B2 | 9/2006 | Herring et al. |
| 7,115,469 B1 | 10/2006 | Halliyal et al. |
| 7,189,652 B1 | 3/2007 | Blosse et al. |
| 7,229,929 B2 | 6/2007 | Chowdhury |
| 7,235,497 B2 | 6/2007 | Powell |
| 7,521,378 B2 | 4/2009 | Fucsko et al. |
| 7,951,728 B2 | 5/2011 | Yokota et al. |
| 8,546,271 B2 * | 10/2013 | Yokota et al. ............... 438/769 |
| 2001/0006853 A1 | 7/2001 | Tanabe et al. |
| 2001/0010975 A1 | 8/2001 | Tanabe et al. |
| 2002/0127888 A1 | 9/2002 | Cho et al. |
| 2002/0172756 A1 | 11/2002 | Joo et al. |
| 2004/0110387 A1 | 6/2004 | Chowdhury |
| 2004/0121563 A1 | 6/2004 | Farnworth et al. |
| 2004/0121569 A1 | 6/2004 | Storbeck et al. |
| 2004/0121598 A1 | 6/2004 | Achutharaman et al. |
| 2004/0124460 A1 | 7/2004 | Lim et al. |
| 2004/0137755 A1 | 7/2004 | Herring et al. |
| 2005/0019992 A1 | 1/2005 | Hong et al. |
| 2005/0266665 A1 | 12/2005 | Youn et al. |
| 2006/0105584 A1 | 5/2006 | Roters et al. |
| 2007/0105307 A1 | 5/2007 | Jeng |

FOREIGN PATENT DOCUMENTS

| | | |
|---|---|---|
| TW | 374853 B1 | 11/1999 |
| TW | 421849 B | 2/2001 |
| WO | WO-03/105190 A2 | 12/2003 |
| WO | WO-2007040845 A2 | 4/2007 |

OTHER PUBLICATIONS

Official Letter from Taiwan's Intellectual Property Office in Taiwan Patent Application No. 100132118 dated May 1, 2013.

Ohnishi et al., Improving gate oxide integrity (GOI) of a W/WNx/dual-poly Si stacked-gate by using Wet-Hydrogen oxidation in 0.14-.mu.m CMOSdevices, IEEE 397-400 (Sep. 1998).

Lin, B. et al., "Selective Oxidation of SI in the Presence of W and WN" Materials Research Society Symposium Proceedings, Materials Research Society, Pittsburg, PA, vol. 525, Apr. 1998, pp. 359-364, XP000879331.

Joo, H.S. et al. "A Novel Method for Selective Oxidation of W/WNx/Poly Gate Stack Using RTP ISSG Technique" Electromechanical Society Proceedings, No. 99-18, 1999, pp. 203-209, XP001019637.

Hiura, Y., et al., "Integration Technology of Polymetal (W/WSiN/Poly-Si) Dual Gate CMOS for 1 Gigabit DRAMs and Beyond", Toshiba Corporation, IEDM 98-389.

Shah, Nitin and Rahul Sharangpani, "Selective Oxidation by Hydrogen-Rich Steam", European Semiconductor Nov. 1999.

Roters, Georg, et al., "Selective Oxidation of Tungsten-Gate Stacks in High Volume DRAM Production", Proceedings, 203rd Meeting of the Electrochemical Society, Paris (2003).

Liu, Yong, et al., "Selective Oxidation of Silicon (100) vs. Tungsten Surfaces by Steam in Hydrogen", Journal of the Electrochemical Society, 150 (10), G597-G601 (2003).

Kee, Robert, J., et al., "The Influence of Pressure, Fluid Flow, and Chemistry on the Combustion-Based Oxidation of Silicon", 28 Proc. Combust. Inst. 1381-1388 (2000).

Table A2.2, NASA NSS 1740.16 (1997).

Akasaka, Y., et al. Conference Proceedings ULSI XIV p. 613, Materials Research Society (1999).

Prosecution History of U.S. Patent No. 7,951,728 as of Jun. 18, 2013.

Office Action of the State Intellectual Property Office of the People's Republic of China in Chinese Patent Application Serial No. 2008101612480 dated Oct. 16, 2009.

Prosecution history of U.S. Appl. No. 11/860,161 as of Oct. 24, 2013.

Prosecution history of U.S. Appl. No. 13/117,931 as of Oct. 24, 2013.

* cited by examiner (PRIOR ART)

METHOD OF IMPROVING OXIDE GROWTH RATE OF SELECTIVE OXIDATION PROCESSES

CROSS-REFERENCE TO RELATED APPLICATIONS

This application a continuation of U.S. patent application Ser. No. 13/117,931, filed May 27, 2011, which is now U.S. Pat. No. 8,546,271, which claims priority to U.S. patent application Ser. No. 11/860,161, filed Sep. 24, 2007, which is now U.S. Pat. No. 7,951,728 which are all herein incorporated by reference.

BACKGROUND OF THE INVENTION

2007 Sep. 24

1. Field of the Invention

Embodiments of the present invention generally relate to the field of semiconductor manufacturing and more specifically to a method and apparatus for the selective oxidation of a composite silicon/metal film.

2. Description of the Related Art

In the manufacture of semiconductor devices, oxidation of silicon containing substrates plays a key role. For example, in a standard semiconductor device, a gate oxide layer is ordinarily situated over a substrate containing a source region, a drain region, and an intervening silicon or polysilicon region. Metal contacts are deposited over the source and drain regions, and a conductive layer deposited over the gate oxide. The entire structure is often depicted as a stack of layers. When a voltage is applied across the gate oxide generating an electric field oriented along an axis from the substrate, through the gate oxide, to the conductive layer, the electrical characteristics of the region between the source and drain region change, either allowing or stopping the flow of electrons between the regions. The gate oxide layer thus occupies a pivotal role in the structure of semiconductor devices.

Often, properties of the device are improved by deposition of other layers in the device. For example, to control diffusion of metal atoms into the gate oxide layer, which degrades the dielectric properties of the gate oxide, a barrier layer may be deposited between the gate oxide and the metal layer. Also, a hard mask layer may be deposited over the metal layer. In order to promote adhesion of such layers, smooth their surfaces, and harden them to diffusion, the barrier or hard mask layers may be treated with a plasma. The plasma treatment can degrade the properties of the gate oxide layer by eroding it from the sides or reducing its thickness. Likewise, the gate oxide layer may be damaged by repeated cycles of deposition, etching, and plasma processing typically involved in modern device fabrication. This damage degrades the gate characteristics of the layer, rendering the device inoperative.

To repair the damage to the oxide layer, it is possible to re-oxidize the device. Re-oxidation creates a thin layer of oxide on the sides of the gate oxide and underlying silicon containing layers, repairing the edge damage. Because oxidizing other regions of the transistor may reduce conductivity and impair the device, oxidizing only certain materials in the device is desired. For example, oxidizing the metal cap over the gate and the metal contacts over the source and drain regions reduces their conductivity. Likewise, a given device may contain more than just the metal surfaces associated with transistors. Selective oxidation targets certain materials, such as silicon and oxides of silicon, while avoiding oxidation of other materials.

Conventional oxygen rich processes oxidize not only the desired layers, but also undesired layers such as metals and barrier layers. Wet oxidation processes, although faster than dry processes, do not promote oxide growth as quickly as steam oxidation. FIGS. 1A-1C set forth oxidation rates of silicon for dry oxidation, wet oxidation, and steam oxidation, respectively. Subjecting a device to heat under an atmosphere of dilute steam rich in hydrogen gas ($H_2$) at low pressure can selectively oxidize silicon containing materials without oxidizing metals or barrier layers. As can readily be appreciated, however, operating a hydrogen combustion chamber at high temperature and pressure has heretofore required combustion of hydrogen in a separate location. At higher pressures, and with long soak times, hydrogen gas may attack barrier and hard mask layers, reducing their effectiveness and forming unwanted metal silicide layers with higher resistivity.

Thus, there is still a need for a selective oxidation process utilizing in situ steam generation that efficiently oxidizes only silicon containing layers of a semiconductor device stack without degrading the properties of barrier or conductive layers.

SUMMARY OF THE INVENTION

The present invention generally provides a method of selectively oxidizing silicon containing materials of a composite substrate, comprising disposing the composite substrate in a chamber, introducing a gas mixture comprising an oxygen containing gas and a hydrogen containing gas to the chamber, such that the ratio of the hydrogen containing gas to the gas mixture is greater than about 65%, pressurizing the chamber to a pressure between about 250 torr and about 800 torr, and heating the chamber to a predetermined temperature for a predetermined time to cause the hydrogen containing gas and the oxygen contain gas to react inside the chamber, selectively oxidizing the composite substrate.

Some embodiments of the invention include a method of selectively oxidizing materials of a composite substrate, comprising disposing the composite substrate in a chamber, introducing a gas mixture to the chamber, the gas mixture comprising an oxygen containing gas and a hydrogen containing gas, and an amount of the hydrogen containing gas is greater than about 65% of an amount of the gas mixture, pressurizing the chamber to a pressure between about 250 torr and about 800 torr, and heating the chamber to a predetermined temperature for a predetermined time causing the hydrogen containing gas and the oxygen contain gas to react inside the chamber, selectively oxidizing the composite substrate.

Other embodiments of the invention provide a method of processing a substrate, comprising disposing the substrate in a rapid thermal processing (RTP) chamber, introducing an amount of a hydrogen containing gas and an amount of an oxygen containing gas to the chamber to form a gas mixture, wherein the gas mixture comprises a hydrogen rich gas mixture, pressurizing the chamber to a pressure greater than about 250 torr, heating the chamber to a processing temperature to cause the gas mixture to react inside the chamber, and selectively oxidizing the substrate.

Other embodiments of the invention provide a method of processing a substrate, comprising at least a silicon containing layer and a metal layer, in a chamber, comprising introducing a hydrogen rich gas mixture to the chamber, pressurizing the chamber to a pressure greater than about 250 torr, reacting the hydrogen rich gas mixture inside the chamber to produce steam, and selectively oxidizing the silicon containing layer.

Further embodiments of the invention provide a method of processing a substrate comprising one or more oxide layers and one or more metal or barrier layers, comprising disposing the substrate in a chamber, introducing a quantity of a hydrogen containing gas and a quantity of an oxygen containing gas into the chamber to create a quantity of a gas mixture, wherein the quantity of the hydrogen containing gas is about 65% to about 85% of the quantity of the gas mixture, pressurizing the chamber to a pressure greater than about 250 torr, reacting the hydrogen containing gas and the oxygen containing gas inside the chamber to produce steam, and oxidizing only the one or more oxide layers on the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1A:
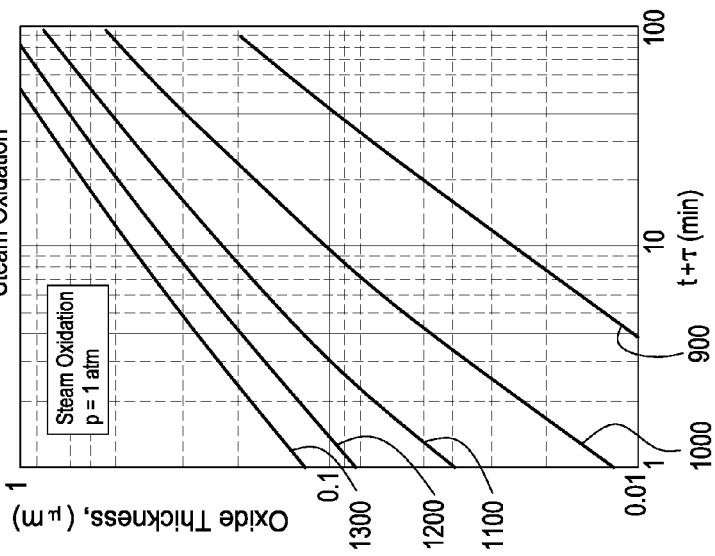
FIG. 1A is a graph of oxidation rate of silicon under dry conditions.
Figure 1B:
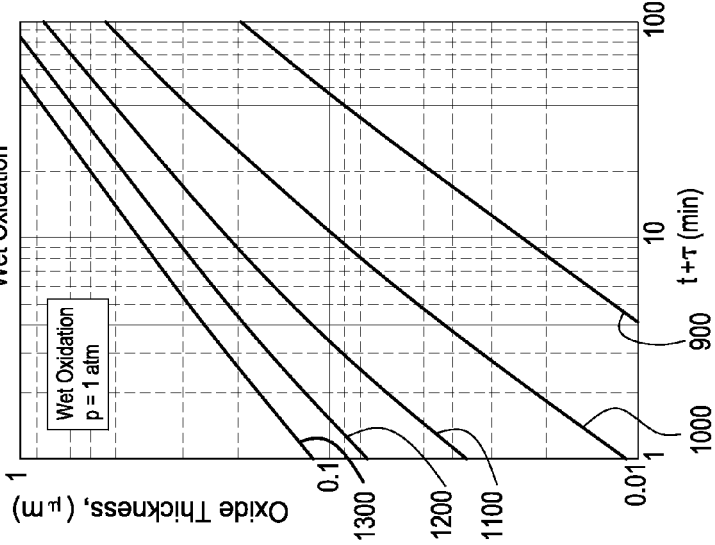
FIG. 1B is a graph of oxidation rate of silicon under wet conditions.
Figure 1C:
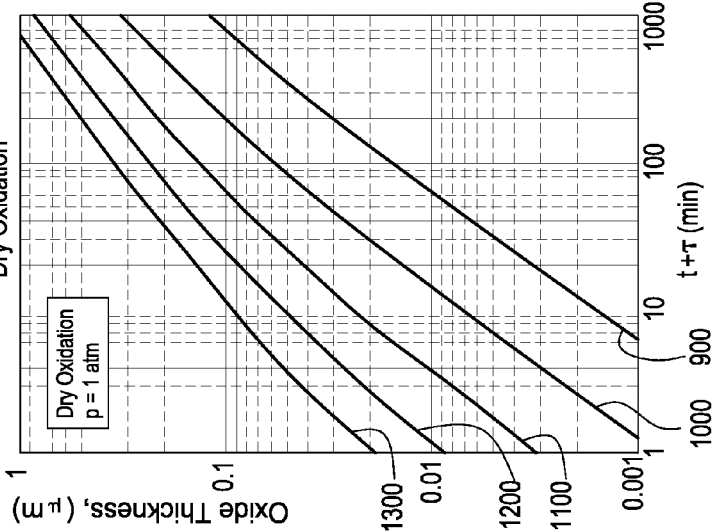
FIG. 1C is a graph of oxidation rate of silicon under steam conditions.
Figure 2:
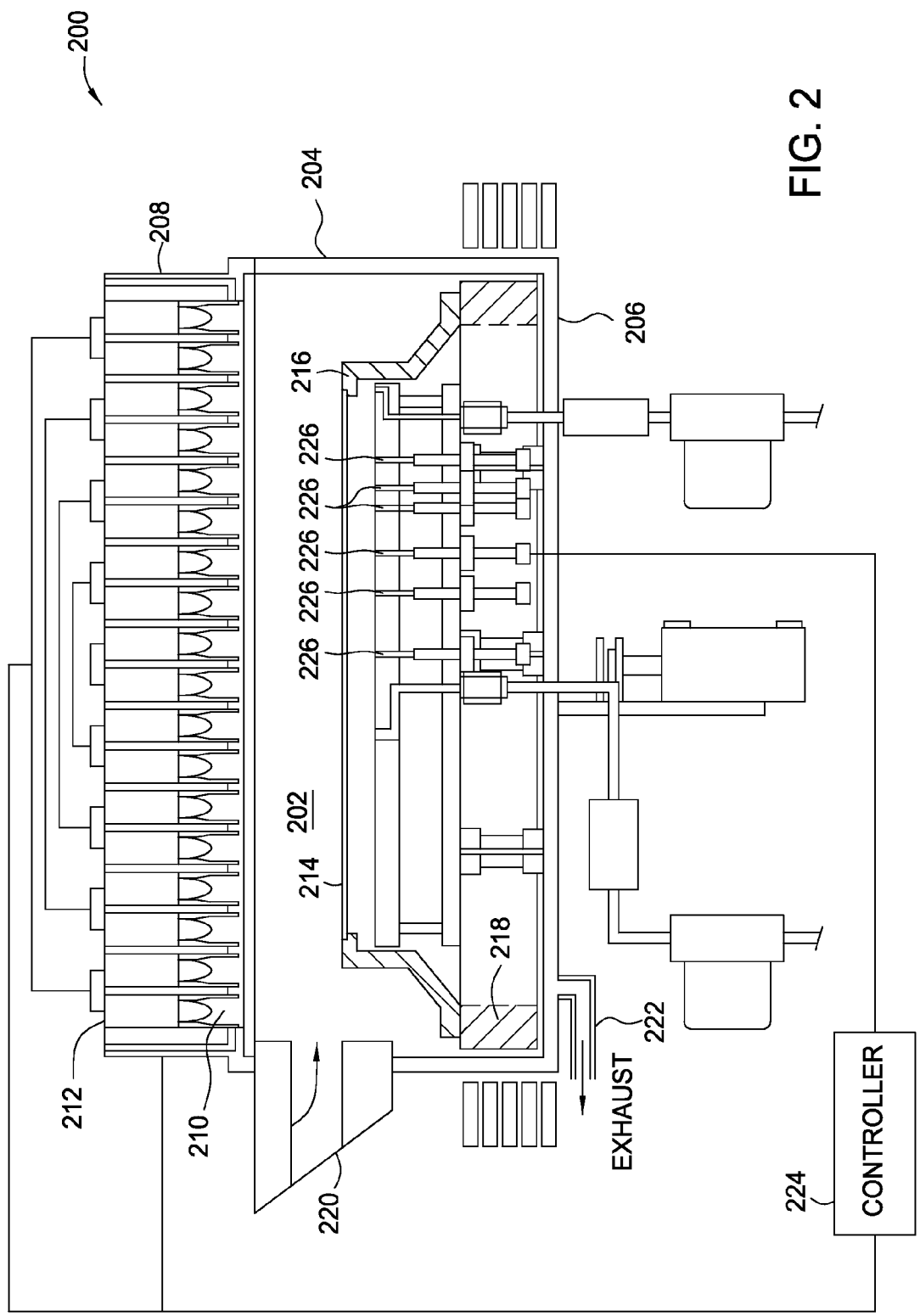
FIG. 2 is an illustration of a rapid thermal heating apparatus that can be used with the process of the present invention.

The present invention describes a method for selectively oxidizing silicon containing materials in a substrate. While the invention will be described below in reference to a rapid thermal heating chamber, such as any of the VANTAGE™ or CENTURA™ devices available from Applied Materials, Inc., of Santa Clara, Calif., it is to be understood that the invention may be practiced in other chambers, including those sold by other manufacturers. FIG. 2 illustrates a rapid thermal heating apparatus 200 that can be used to carry out the process of the present invention. The apparatus features a process chamber 202 that may be evacuated or filled with selected gases, and a side wall 204 and bottom enclosure 206. The upper portion of the sidewall is sealed against a light pipe assembly 208, from which radiant energy is directed into the chamber. The light pipe assembly 208 includes a plurality of tungsten halogen lamps 210, for example Sylvania EYT lamps, each mounted into a light pipe 212 which may be made of stainless steel, brass, aluminum, or other metal.

A substrate 214 is supported within the process chamber 200 by a support ring 216 that contacts the edge of the substrate. The support ring 216 is made of a material capable of withstanding high temperatures, such as silicon carbide, without imparting impurities to the substrate. The support ring 216 may be mounted on a rotation cylinder 218. In one embodiment, a quartz rotation cylinder capable of rotating the support ring and substrate thereon may be used. Rotation of the substrate promotes uniform temperature distribution.

Process gases may be admitted to the chamber through representative portal 220, and exhaust evacuated through representative portal 222. In some embodiments, multiple gas feed and exhaust portals may be used. A temperature controller 224 receives measurements from pyrometers 226 and adjusts power to lamps 210 to achieve even heating.

Figure 3A:
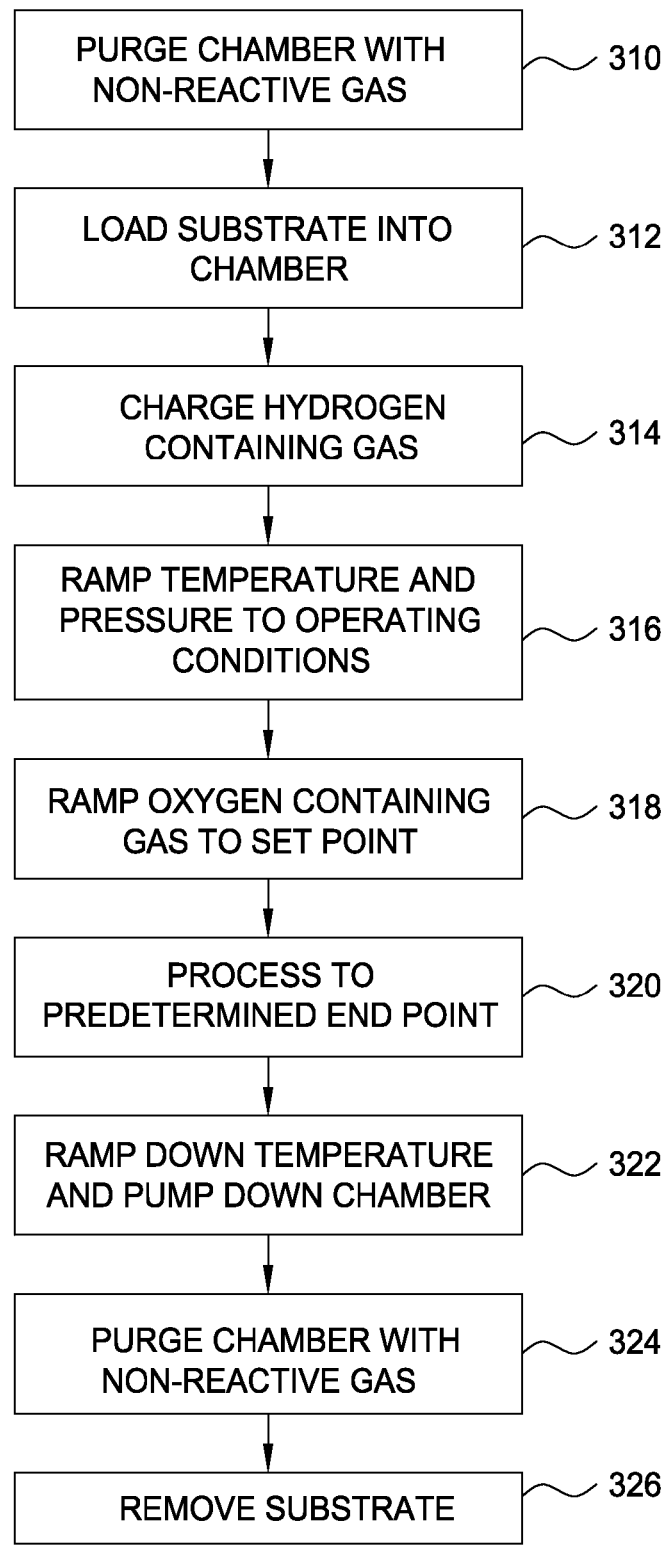
FIG. 3A is a flowchart that illustrates one embodiment of the present invention.

FIG. 3A is a flowchart that illustrates a method of selectively oxidizing a substrate according to the present invention. The first step in the process 310 is to purge any reactive gases from the chamber. Purging avoids any unwanted chemical reactions on the substrate during preparatory phases of the oxidation treatment when temperatures and pressures may be elevated. It is an objective of the present invention to oxidize only silicon containing layers of a composite substrate comprising silicon containing layers, metal layers, and optionally barrier or capping layers. To accomplish this objective, composition of gases in the process chamber may be controlled during any process step featuring elevated temperature or pressure. The purge is accomplished by pumping all gases out of the chamber and then flowing a non-reactive gas into the chamber to create a non-reactive gas atmosphere in the process chamber. The non-reactive gas does not react with any substrate material during processing. Gases which are non-reactive in the process of the present invention include, but are not limited to, nitrogen gas ($N_2$), helium (He), argon (Ar), neon (Ne), and xenon (Xe).

Figure 4A:
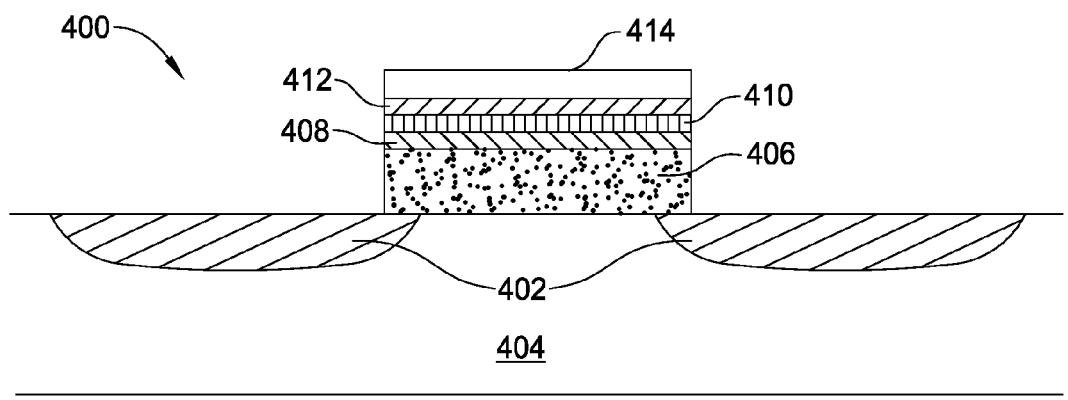
FIG. 4A is a cross-sectional view of a substrate prior to applying a selective oxidation process according to one embodiment of the present invention.

A substrate having multiple layers of silicon containing materials, metals, and optionally barrier or capping layers is disposed within the chamber in the next step of the process 312. The layers may be patterned to form device structures, such as transistors, on the substrate. FIG. 4A illustrates a typical gate transistor structure 400. Doped silicide regions 402 are disposed within a polysilicon domain 404 of the substrate. The doped silicide regions 402 form source and drain regions for the transistor. Over the doped silicide regions 402, multiple layers of polysilicon 406, gate oxide 408, barrier material 410, metal contacts 412, and protective or hard mask material 414 may be deposited. Additionally, and not shown, metal contacts may be deposited directly atop the doped silicide regions, with or without barrier or nucleation layers between. The process of the present invention selectively oxidizes only the polysilicon and gate oxide layers, along with other silicon containing areas of the substrate, without oxidizing the metal or other layers.

The substrate may be introduced to the chamber through a slit valve in the process chamber. A transfer robot configured as part of a processing cluster or platform may be used to load the substrate into the chamber. Alternately, a tray loader may be used with a cartridge device to load and unload multiple substrates consecutively. Furthermore, a carousel arrangement may be used to transport substrates into and out of the process chamber as part of a rotary processing cluster, or a linear processing assembly may be used.

Referring once again to FIG. 3A, the substrate supported on the support ring in the process chamber under a non-reactive atmosphere is next subjected to a temperature and pressure ramp-up step 314. Hydrogen containing gas may be fed to the process chamber prior to ramping-up temperature and pressure. Alternately, the non-reactive atmosphere may be maintained during the ramp-up by flowing non-reactive gas into and out of the process chamber. Pressure in the chamber may be precisely controlled and any fugitive emissions that may escape the substrate removed by the flowing gases as temperature increases. Temperature and pressure may be ramped in any pattern, simultaneously or consecutively, up to the desired predetermined process conditions. The temperature ramp may be designed to confer the added benefit of annealing any of the various layers of the substrate. It has been found that the best selective oxidation conditions are obtained at pressures between about 150 torr to about 800 torr, especially between about 250 torr to 600 torr, such as 450 torr. It has also been found that the best selective oxidation conditions are achieved at temperatures greater than about 700° C., especially between about 800° C. and about 1000° C., such as about 950° C.

Referring again to FIG. 3A, a hydrogen containing gas may be fed to the process chamber before or after ramping-up temperature and pressure. Although hydrogen ($H_2$) gas is preferred, another gas capable of producing water vapor when oxidized, such as ammonia ($NH_3$) may be used. When the desired flow rate of hydrogen containing gas is reached, and operating conditions established, an oxygen containing gas is fed into the process chamber to create a gas mixture in step 318. Although oxygen ($O_2$) gas is preferred, other oxidizing gases, such as nitrous oxide ($N_2O$) may be used. The flow rate of the oxygen containing gas is ramped up to a set point to allow temperature, pressure, and flow controls to respond as the reaction begins. The hydrogen containing gas and the oxygen containing gas react, generating in-situ steam, which in turn drives the selective oxidation reaction on the substrate. It is thought that water molecules diffuse into the silicon containing material crystal network, liberating hydrogen at Si—Si or Si—$SiO_2$ bonds. Processing continues in step 320 until a predetermined end point is reached, such as a certain amount of time. Temperature is reduced and the chamber evacuated in step 322 to remove reactive species. A non-reactive gas is once again charged to the chamber in step 324 to complete the process, after which the substrate is removed in step 326.

Figure 3B:
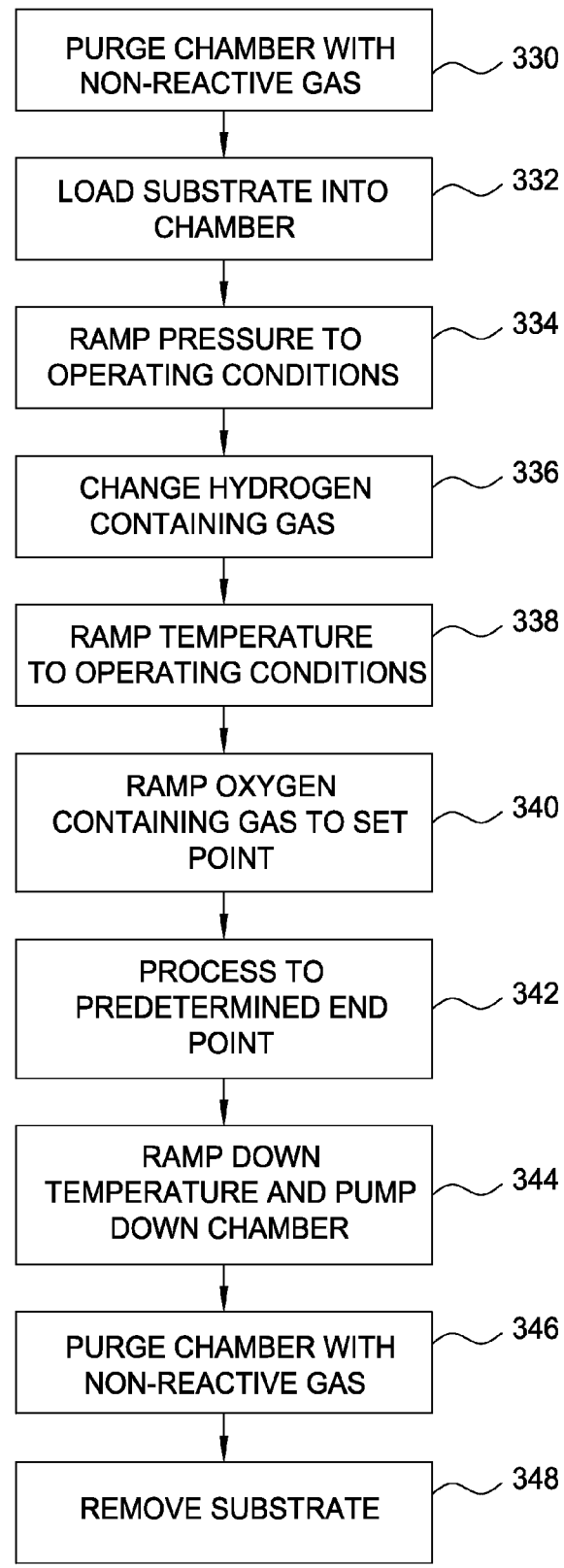
FIG. 3B is a flowchart that illustrates another embodiment of the present invention.
Figure 3C:
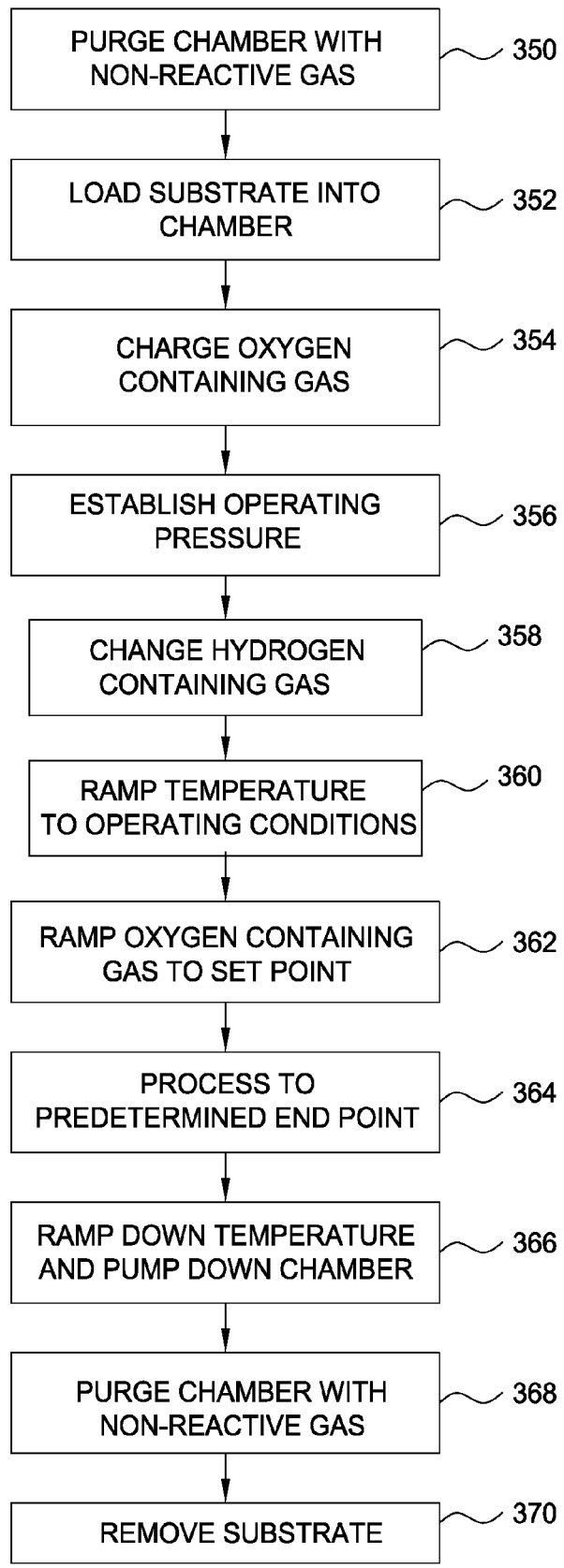
FIG. 3C is a flowchart that illustrates another embodiment of the present invention.

FIGS. 3B and 3C illustrate alternate embodiments of the process of the invention. FIG. 3B illustrates a variation in which a non-reactive gas is used to establish chamber operating pressure in step 334 before hydrogen containing gas is added in step 336. Temperature may be established after charging hydrogen containing gas, as shown in step 338, and then oxygen containing gas charged to the chamber in step 340. FIG. 3C illustrates a variation in which the oxygen containing gas is charged first in step 354, followed by pressuring up in step 356, charging hydrogen containing gas in step 358, and establishing temperature in step 360.

In alternate embodiments, hydrogen containing gas and oxygen containing gas may both be ramped-up after the chamber reaches the desired temperature and pressure, with the advantage that a single flow upset will not result in unwanted acceleration of the reaction. In another alternate embodiment, hydrogen containing gas may be introduced to the chamber before reaching the desired temperature and pressure points, with the potential advantage of passivating any metal layers on the substrate, further reducing the oxidation potential of the metals. In other embodiments, a non-reactive or carrier gas may be used with the hydrogen containing gas or the oxygen containing gas, or both, and may be fed separately or with either gas. The gases may be mixed outside the reaction chamber or fed individually to the chamber. Use of a non-reactive gas may promote mixing and selectivity, but will likely reduce oxidation rate.

The reaction is driven by the temperature and pressure in the reaction zone. The reaction zone is heated by convection from the hot substrate and by energy released from the oxidation reaction. Temperatures required to drive the reaction are thus found in the immediate vicinity of the substrate surface. In some embodiments, the reaction may be confined to a zone up to 1 cm from the substrate surface. Temperatures above 700° C. are generally effective to promote selective oxidation reactions. Temperature is controlled through sensors disposed in the chamber and connected to a temperature controller that varies power to the heat lamps.

Figure 5:
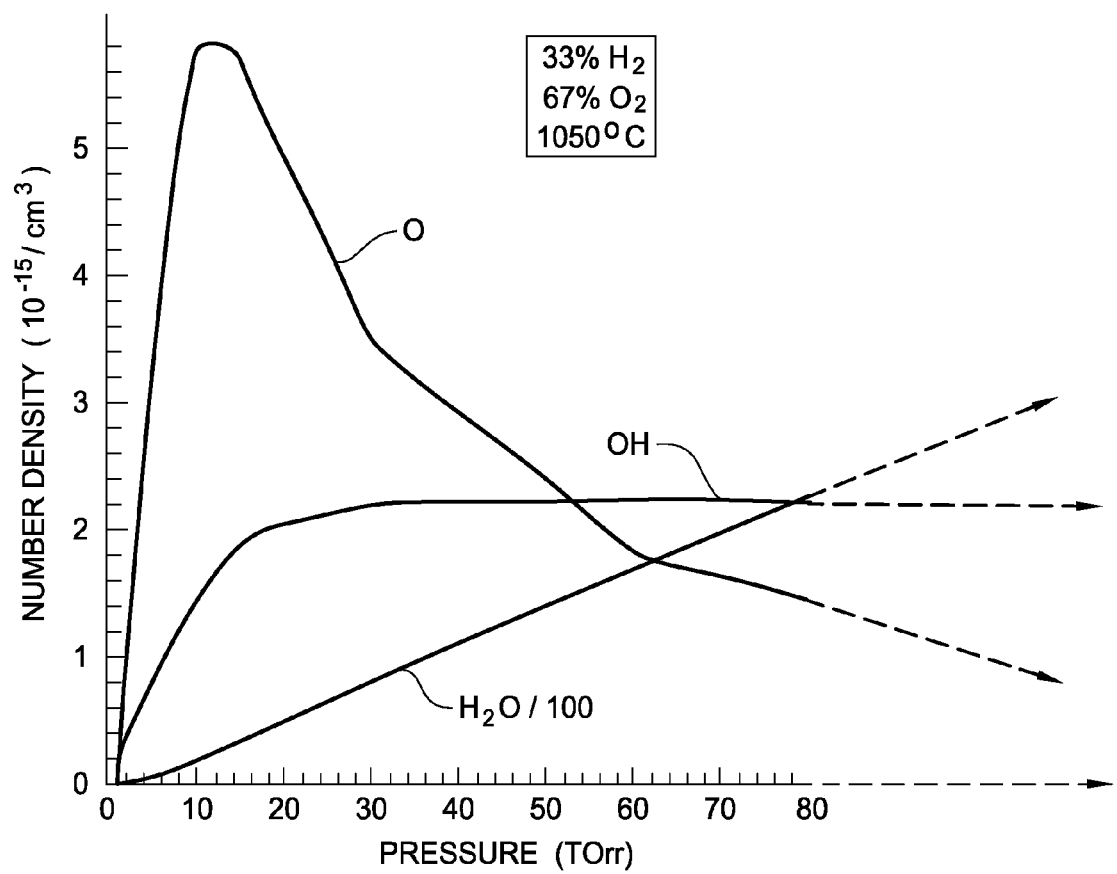
FIG. 5 is a graph showing concentration of reactive species at different pressures.

Effective control of flow rates, temperatures, and pressures contributes to a successful selective oxidation process. If there is too much oxygen in the gas mixture, oxygen radical species predominate, causing unwanted oxidation reactions. FIG. 5 is a reactive species diagram showing relative concentration of oxidizing species at different pressures for a gas mixture characteristic of traditional oxygen rich oxidation reactions. It illustrates the general rule that as pressure increases, concentration of undesirable oxidizing species declines. Due to their size, oxygen radical species are better able to diffuse into the crystal structure of metals than are water molecules. Thus, higher concentration of oxygen radical species results in lower selectivity for silicon containing materials. Higher chamber pressures result in fewer radical species because oxygen radicals are quickly scavenged by hydrogen containing species.

Figure 6:
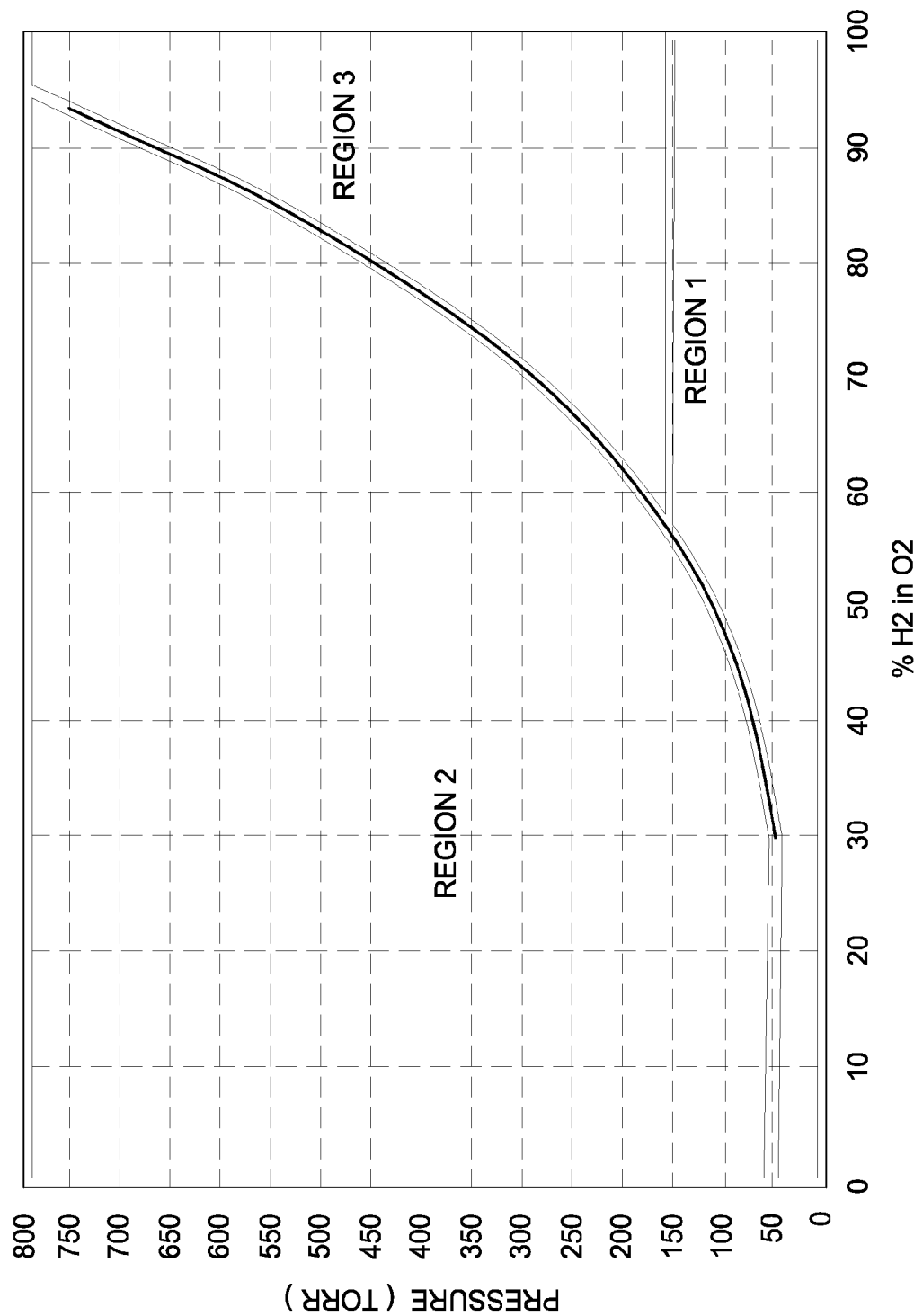
FIG. 6 is a process window diagram illustrating operable process conditions according to one embodiment of the invention.

While it is desirable to maximize the rate of the selective oxidation reaction, oxidation and combustion reactions can be explosive if the wrong mixture of reactants is used. It has been found that a mixture of hydrogen gas ($H_2$) and oxygen gas ($O_2$) of greater than about 65% hydrogen creates the most advantageous reaction conditions. A hydrogen rich gas mixture generally results in acceptable oxidation rate and high selectivity. FIG. 6 shows a reaction rate diagram relating to the process of the present invention. Region 1 represents operating windows used currently in selective oxidation processes. Region 2 represents the large explosive potential of mixtures of hydrogen and oxygen gas, compositions which must be avoided. Region 3 represents the target operating window of the present invention. Favorable results have been obtained with a mixture of about 65% to about 95% hydrogen in oxygen, especially about 75% to about 90%, such as about 85% hydrogen in oxygen. At these conditions, slight variations in composition within the reaction chamber can lead to substantial temperature variation. Likewise, slight variation in flow rate of reactants can cause the reaction mixture to approach explosive limits. Interlocks are used to ensure the flow rate of oxygen containing gas stays below control limits with an acceptable margin of safety. The amount of oxygen containing gas fed to the reactor may be controlled by specifying a ratio of oxygen containing gas flow rate to hydrogen containing gas flow rate, or by specifying ratios of both to a non-reactive or carrier gas, or by any other method designed to control the proportion of reactive gases in the gas mixture.

Figure 4B:
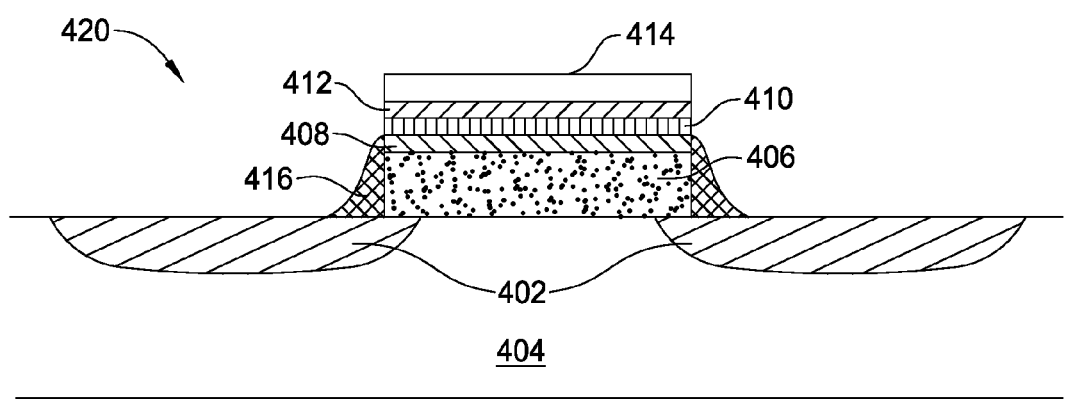
FIG. 4B is a cross-sectional view of a substrate following application of a selective oxidation process according to one embodiment of the present invention.

The reaction is allowed to proceed a set amount of time. A thin film of oxide growth on the silicon containing materials of the substrate is desired. At these process conditions, a duration of about 1 to about 5 minutes is sufficient to produce a new oxide layer 20 to 50 Angstroms thick. FIG. 4B illustrates a device structure 420 after selective oxidation has been performed. Oxide layers 416 have grown adjacent to silicon containing layers of the structure. With the process of the present invention, oxidation selectivities of polysilicon and silicon dioxide relative to tungsten metal up to 99.6% have been obtained. When the end point is reached, temperature may be ramped down and the reaction chamber may be pumped out and non-reactive gas charged. The chamber may be purged briefly to ensure no potentially reactive gases remain to degrade the substrate, and then the substrate is removed from the chamber for further processing.

The foregoing process may be used to selectively oxidize many silicon containing materials on a substrate. Such silicon containing materials include, but are not limited to, polysilicon (or polycrystalline silicon), doped silicon, microcrystalline silicon, doped microcrystalline silicon, amorphous silicon, doped amorphous silicon, generic silicon, doped or undoped, not fitting any of the former labels, partially oxidized silicon materials substantially comprising silicon dioxide ($SiO_2$), and combinations thereof. Likewise, many popular metal conductors and barrier or protective layers may be safely exposed to this process. Metal layer compositions which will not be oxidized under such conditions include, but are not limited to, aluminum (Al), copper (Cu), tungsten (W), tungsten nitride (WN), titanium (Ti), titanium nitride (TiN), tantalum (Ta), tantalum nitride (TaN), tantalum carbonitride (TaCN), and combinations thereof.

Examples of selective oxidation treatments performed according to embodiments of the invention are set forth in Table 1 below. The embodiments below illustrate selective oxidation of silicon versus tungsten metal using hydrogen gas and oxygen gas as the reactive species. As mentioned above, however, it should be understood that other hydrogen containing gases, such as ammonia, may be used, and other oxygen containing gases, such as nitrous oxide, may be used to perform processes representing other embodiments of the invention. As also mentioned above, embodiments in accordance with this invention other than those specifically illustrated in Table 1 will achieve selective oxidation relative to metals other than tungsten.

TABLE 1

| Example | Temperature (C.) | Pressure (torr) | Percent Hydrogen in Oxygen | Selectivity (%) |
| --- | --- | --- | --- | --- |
| 1 | 850 | 150 | 85 | 3 |
| 2 | 850 | 300 | 95 | 99.4 |
| 3 | 850 | 450 | 85 | 98.4 |
| 4 | 950 | 150 | 85 | 5 |
| 5 | 950 | 300 | 95 | 99.3 |
| 6 | 950 | 450 | 85 | 99.6 |

CONCLUSION

Embodiments of the present invention relating to a method and apparatus for the selective oxidation of a composite silicon/metal film have been described. Silicon containing materials in a semiconductor device are oxidized quickly without oxidizing other layers of the device, such as metal layers, through high pressure in-situ steam generation. While the foregoing is directed to embodiments of the present invention, other and further embodiments of the invention may be devised without departing from the basic scope thereof. The scope of the invention is defined by the claims that follow.

The invention claimed is:

1. A method of processing a substrate, having at least a silicon containing layer and a metal layer, in a chamber, the method comprising:
    (a) pressurizing the chamber to around 450 Torr;
    (b) maintaining the temperature of the substrate at 700 degrees Celsius or higher;
    (c) introducing a gas mixture to the chamber, the gas mixture comprising an oxygen containing gas and a hydrogen containing gas, wherein the hydrogen containing gas is at least about 65% of the gas mixture;
    (d) reacting the gas mixture inside the chamber to produce steam; and
    (e) selectively oxidizing the silicon containing layer, wherein (c)-(e) are performed in sequence.

2. The method of claim 1, wherein the oxygen containing gas is nitrous oxide and the hydrogen containing gas is ammonia.

3. The method of claim 1, wherein the hydrogen containing gas and the oxygen containing gas are mixed outside the chamber to produce the gas mixture.

4. The method of claim 1, wherein selectively oxidizing the silicon containing layer comprises oxidizing the silicon containing layer without oxidizing the metal layer.

5. The method of claim 1, wherein the gas mixture further comprises a non-reactive gas.

6. The method of claim 5, wherein the non-reactive gas comprises helium (He), nitrogen gas ($N_2$), argon (Ar), neon (Ne), xenon (Xe), or a combination thereof.

7. The method of claim 1, wherein the concentration of hydrogen gas is between about 70% and about 90%.

8. The method of claim 1, wherein the silicon containing layer comprises silicon, doped silicon, polysilicon, doped polysilicon, amorphous silicon, doped amorphous silicon, microcrystalline silicon, doped microcrystalline silicon, silicon dioxide ($SiO_2$), or combinations thereof.

9. A method of processing a substrate, having at least a silicon containing layer and a metal layer, in a chamber, the method comprising:
    (a) introducing a gas mixture to the chamber, the gas mixture comprising an oxygen containing gas and a hydrogen containing gas, wherein the hydrogen containing gas is at least about 65% of the gas mixture;
    (b) pressurizing the chamber to around 450 Torr;
    (c) maintaining the temperature of the substrate at 700 degrees Celsius or higher;
    (d) reacting the gas mixture inside the chamber to produce steam; and
    (e) selectively oxidizing the silicon containing layer, wherein (a) is performed before (b)-(e).

10. The method of claim 9, wherein a non-reactive gas is introduced into the chamber prior to (a).

11. The method of claim 10, wherein the non-reactive gas comprises helium (He), nitrogen gas ($N_2$), argon (Ar), neon (Ne), xenon (Xe), or a combination thereof.

12. The method of claim 9, wherein the concentration of hydrogen gas is between about 70% and about 90%.

13. The method of claim 9, wherein the silicon containing layer comprises silicon, doped silicon, polysilicon, doped polysilicon, amorphous silicon, doped amorphous silicon, microcrystalline silicon, doped microcrystalline silicon, silicon dioxide ($SiO_2$), or combinations thereof.

* * * * *